(12) United States Patent
 Song (10) Patent No.: US 10,964,509 B2
(45) Date of Patent: Mar. 30, 2021

(54) SUBSTRATE SIDE-DEPOSITION APPARATUS

(71) Applicant: TETOS Co., Ltd., Asan-si (KR)

(72) Inventor: Kun Ho Song, Asan-si (KR)

(73) Assignee: TETOS Co., Ltd., Asan-si (KR)

( * ) Notice: Subject to any disclaimer, the term of this patent is extended or adjusted under 35 U.S.C. 154(b) by 17 days.

(21) Appl. No.: 16/510,987

(22) Filed: Jul. 15, 2019

(65) Prior Publication Data

US 2020/0043696 A1 Feb. 6, 2020

(30) Foreign Application Priority Data

Aug. 3, 2018 (KR) ........................ 10-2018-0090615

(51) Int. Cl.

| | | |
|---|---|---|
| *H01J 37/20* | (2006.01) | |
| *C23C 14/34* | (2006.01) | |
| *C23C 14/50* | (2006.01) | |
| *H01J 37/34* | (2006.01) | |
| *H05K 3/16* | (2006.01) | |
| *H01J 37/32* | (2006.01) | |

(52) U.S. Cl.
 CPC .......... *H01J 37/20* (2013.01); *C23C 14/3464* (2013.01); *C23C 14/505* (2013.01); *H01J 37/32385* (2013.01); *H01J 37/3426* (2013.01); *H01J 37/3447* (2013.01); *H05K 3/16* (2013.01); *H01J 2237/20214* (2013.01); *H05K 2203/1518* (2013.01); *H05K 2203/1554* (2013.01)

(58) Field of Classification Search
 CPC ................................................. H01J 37/32385
 See application file for complete search history.

(56) References Cited

U.S. PATENT DOCUMENTS

| | | | | |
|---|---|---|---|---|
| 4,851,095 A | * | 7/1989 | Scobey ................. | C23C 14/562 204/192.12 |
| 4,917,708 A | * | 4/1990 | Yamaguchi .............. | B23Q 7/02 451/102 |
| 7,295,421 B2 | * | 11/2007 | Mihara .................. | H01C 1/148 361/306.1 |

FOREIGN PATENT DOCUMENTS

KR 10-1613773 B1 4/2016

\* cited by examiner

*Primary Examiner* — Jason Berman
(74) *Attorney, Agent, or Firm* — Revolution IP, PLLC (57) ABSTRACT

A substrate side-deposition apparatus includes a substrate mounting drum rotatable within a chamber and allowing at least one substrate to be inserted and mounted in a direction from a circumferential surface toward a center; and at least one source target configured to deposit wiring based on sputtering to a lateral side portion of the substrate exposed protruding from the circumferential surface of the substrate mounting drum.

2 Claims, 4 Drawing Sheets

SUBSTRATE SIDE-DEPOSITION APPARATUS

CROSS-REFERENCE TO RELATED APPLICATION

This application claims priority from Korean Patent Application No. 10-2018-0090615, filed on Aug. 3, 2018 in the Korean Intellectual Property Office, the disclosure of which is incorporated herein by reference.

BACKGROUND OF THE INVENTION

(a) Field of the Invention

The disclosure relates to a substrate deposition apparatus, and more particularly to a substrate side-deposition apparatus, in which at least one substrate is mounted to a substrate mounting drum with a substrate side portion facing toward a source target, and the substrate mounting drum is rotatable, so that three-dimensional deposition to the substrate side portion can be uniform and improved in quality.

(b) Description of the Related Art

Wiring for a circuit for connecting elements, supplying power and transceiving an electric signal is formed on a substrate to which various semiconductors and the like electronic elements are mounted. To form the wiring on the substrate, various wiring forming methods may be used.

Recently, a silk printing technique has been employed to form the wiring on the substrate. In other words, the method of forming the wiring on the substrate based on the silk printing technique refers to a method of employing the silk printing technique to apply a silver paste and form high-conductive wiring onto the substrate.

However, such a conventional method of forming the wiring on the substrate based on the silk printing technique has shortcomings that electric characteristics of a wiring circuit is not uniform due to high resistance of the wiring, external influences of a material to be coated, and low-uniformity of the material when the material is applied. Further, such a wet process has disadvantages that physical electric characteristics of an end product are affected by contamination with impurities.

Meanwhile, there has recently been a growing interest in a technique for forming a substrate without a bezel to achieve a large-screen and high-definition display. To provide the bezel-less substrate, a technique is required to form the wiring on a lateral side of a substrate is required.

Regarding the technique for providing the bezel-less substrate, Korean Patent No. 10-1613773 (hereinafter, referred to as the "related art") has disclosed a touch panel in which metal wiring connected to a Tx electrode pattern and an Rx electrode pattern is extended and connected to a lateral side and a back side of a display apparatus in order to reduce a width of a bezel and increase an active area.

The related art discloses only the panel decreased in the width of the bezel by forming the wiring on the lateral side of the substrate, but does not explicitly teach a concrete method of forming the wiring on the lateral side of the substrate.

Besides, the related art does not propose any specific method of forming wiring, which has low resistance and is excellent in electric characteristics, on a side portion of the substrate.

When a conventional inline-sputtering deposition apparatus is used to deposit wiring to a substrate side portion, there are shortcomings that time, efforts and costs required in configuring the whole facilities are increasing because very long equipment is needed, a source target is individually needed for each side of the substrate, and the source target has to have an adjustable deposition angle.

SUMMARY OF THE INVENTION

Accordingly, the disclosure is conceived to solve the foregoing problems, and an aspect of the disclosure is to provide a substrate side-deposition apparatus, in which at least one substrate is mounted to a substrate mounting drum with a substrate side portion facing toward a source target, and the substrate mounting drum is rotatable, so that three-dimensional deposition to the substrate side portion can be uniform and improved in quality.

In accordance with an embodiment of the present disclosure, there is provided a substrate side-deposition apparatus including a substrate mounting drum rotatable within a chamber and allowing at least one substrate to be inserted and mounted in a direction from a circumferential surface toward a center; and at least one source target configured to deposit wiring based on sputtering to a lateral side portion of the substrate exposed protruding from the circumferential surface of the substrate mounting drum, wherein: the substrate side portion includes a lateral side of the substrate, and top and bottom sides of the substrate adjacent to the lateral side, and the wiring on the substrate side portion is formed to electrically connect a top circuit pattern formed on the top side of the substrate and a bottom circuit pattern formed on the bottom side of the substrate, the substrate is inserted in and mounted to a substrate mounting slot radially mounted to the substrate mounting drum, and the source target includes a plurality of source targets, and the plurality of source targets includes same metal targets or different metal targets.

The substrate side-deposition apparatus may further include a target shutter configured to cover the surfaces of other source targets adjacent to a source target performing the sputtering when the plurality of source targets includes the different metal targets.

BRIEF DESCRIPTION OF THE DRAWINGS

The above and/or other aspects of the disclosure will become apparent and more readily appreciated from the following description of the exemplary embodiments, taken in conjunction with the accompanying drawings, in which.

DETAILED DESCRIPTION

Figure 1:
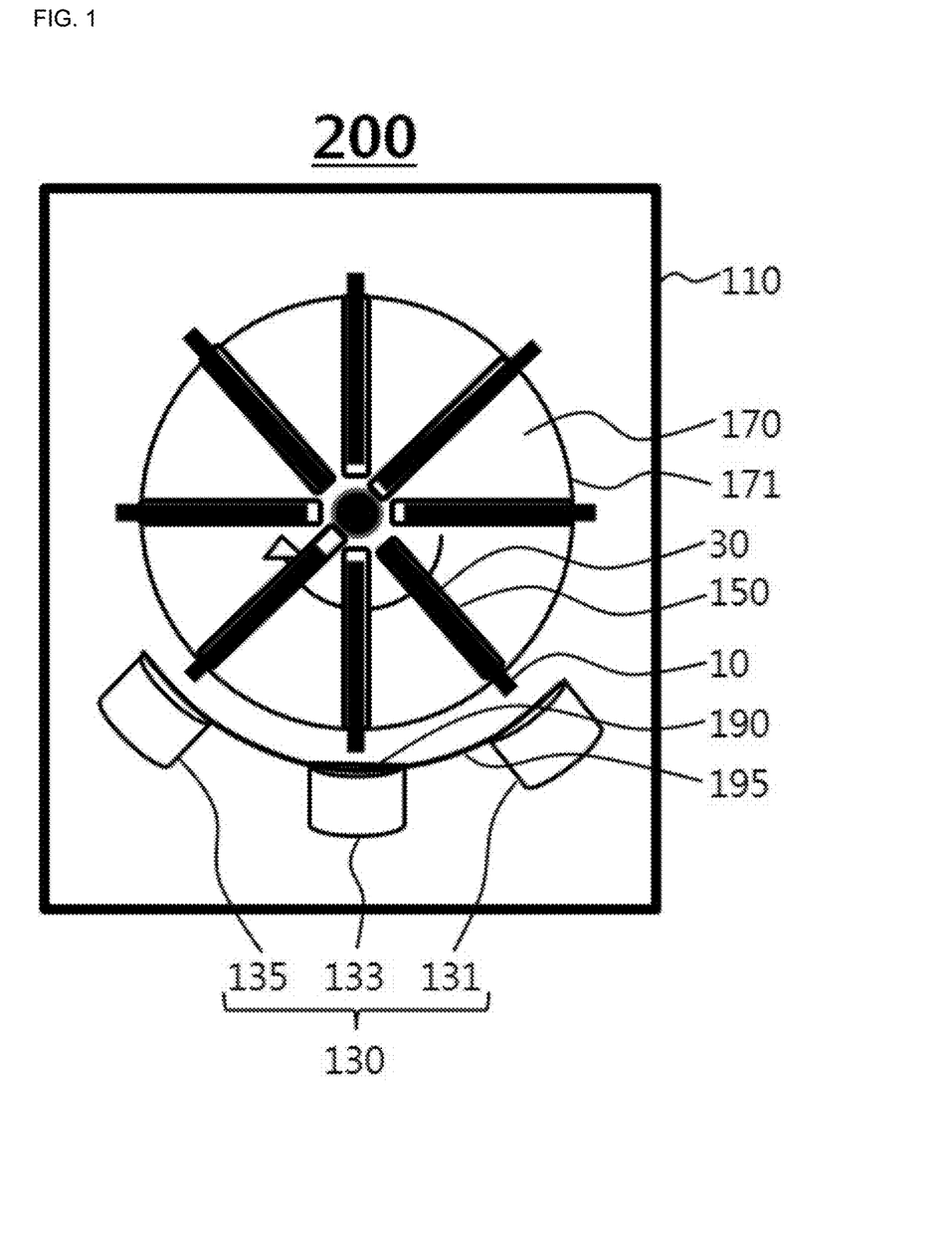
FIG. 1 is a schematic cross-section view of a substrate side-deposition apparatus according to an embodiment of the disclosure.

FIG. 1 is a schematic cross-section view of a substrate side-deposition apparatus according to an embodiment of the disclosure, As shown in FIG. 1, a substrate side-deposition apparatus 200 according to an embodiment of the disclosure includes a substrate mounting drum 170 to which at least one substrate 30 is radially mounted, and at least one source target 130 disposed adjacent to the circumferential surface of the substrate mounting drum 170 and configured to perform wiring deposition to a lateral side portion 10 of the substrate by sputtering. Further, as necessary, a target shutter 190 may be further provided to prevent the adjacent source targets from contamination.

The substrate mounting drum 170 is shaped like a cylinder or a polyprism and rotatably placed inside a vacuum chamber 110. Further, the substrate mounting drum 170 allows at least one substrate 30 to be inserted and mounted in a radial direction, i.e. a direction from the circumferential surface 171 to the center. In other words, the substrate mounting drum 170 according to the disclosure is rotatably disposed inside the chamber 110 and allows at least one substrate 30 to be inserted and mounted as oriented toward the center of the circumferential surface 171.

Figure 2:
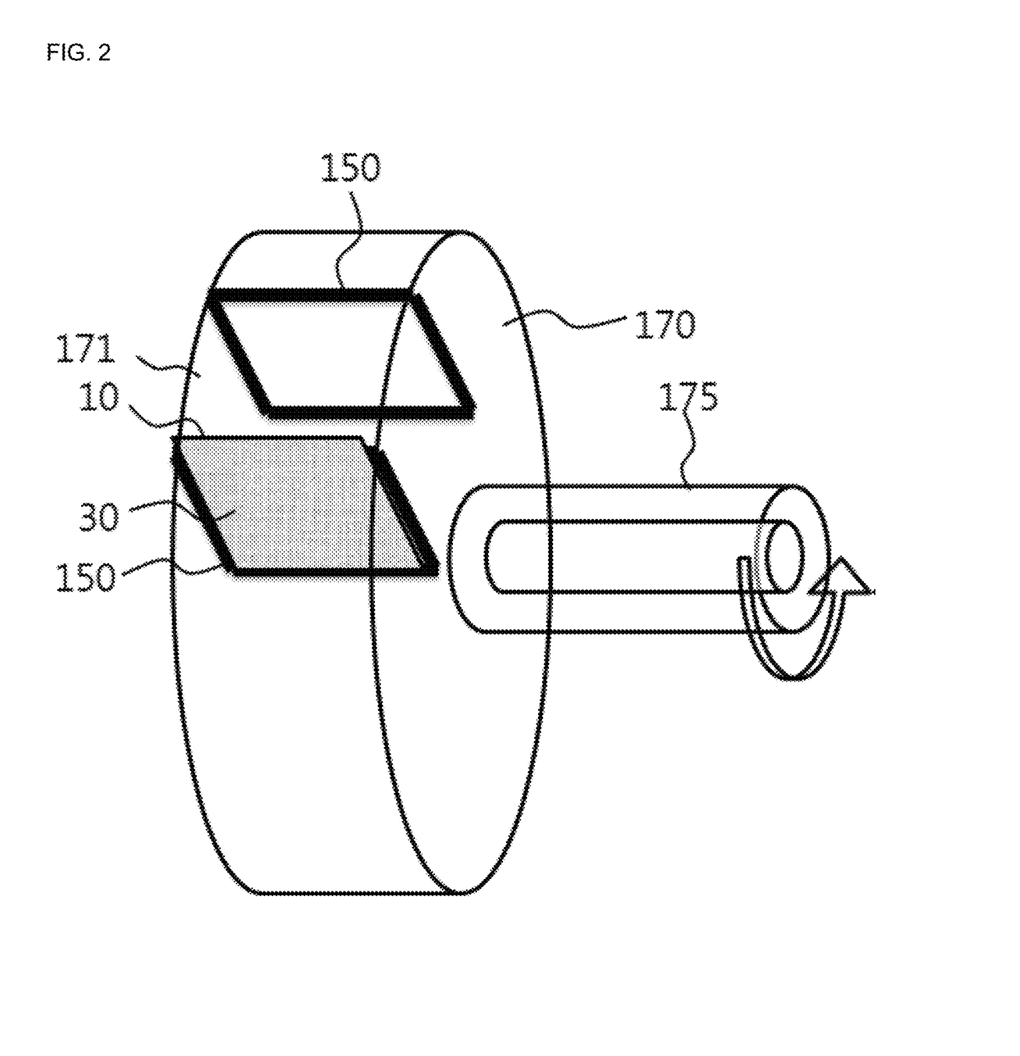
FIG. 2 is a transparent perspective view of a substrate mounting drum in a substrate side-deposition apparatus according to an embodiment of the disclosure.

Specifically, the substrate mounting drum 170 is shaped like a cylinder or a polyprism, and, as shown in FIG. 2, connects with a rotary rod 175 at one lateral side thereof. In the substrate mounting drum 170, the substrate 30 is mounted in a direction from the circumferential surface 171 toward the center, and thus a plurality of substrates 30 are radially mounted. The rotary rod 175 is mounted and coupled to be rotatable within the vacuum chamber 110. Consequently, the substrate mounting drum 170 is rotatably disposed within the vacuum chamber 110 in a state that at least one substrate is radially mounted to the substrate mounting drum 170.

Like this, at least one substrate 30 is radially inserted in and mounted to the substrate mounting drum 170, and thus the lateral side portion 10 of the substrate 30 is disposed protruding from the circumferential surface 171 of the substrate mounting drum 170. According to the disclosure, the substrate side-deposition apparatus 200 refers to a deposition apparatus for depositing the wiring to the lateral side portion 10 of the substrate 30, and therefore the substrate 30 has to be disposed with the exposed lateral side portion 10 coming out of the circumferential surface 171 of the substrate mounting drum 170.

As described above, at least one substrate side portion 10 exposed protruding from the circumferential surface 171 of the substrate mounting drum 170 is subjected to sputtering based on at least one source target 130. Therefore, at least one source target 130 is disposed to deposit a predetermined wiring pattern to the substrate side portion 10. That is, at least one source target 130 performs sputtering to deposit the wiring on the lateral side portion 10 of the substrate 30 exposed protruding from the circumferential surface 171 of the substrate mounting drum 170.

The source target 130 is actualized as a metal target to be deposited onto the lateral side portion 10 of the substrate 30, and this metal target serves as a cathode during the sputtering. The source target 130 corresponding to the metal target used as the cathode deposits the wiring formed as a predetermined metal layer on the lateral side portion 10 of the substrate 30.

Meanwhile, the substrate mounting drum 170 rotates while the sputtering is performed by the source target 130.

In other words, the source target 130 performs three-dimensional (3D) deposition to the substrate side portion 10 (for example, to the lateral side of the substrate and the top and bottom sides of the substrate adjacent to the lateral side).

To perform the 3D deposition to the lateral side portion 10 of the substrate 30, the substrate side-deposition apparatus 200 according to the disclosure does not need to use individual source targets for performing the sputtering to the lateral side of the substrate and the top and bottom sides of the substrate adjacent to the lateral side, but uses one source target. Accordingly, the substrate side-deposition apparatus 200 according to the disclosure minimizes time, efforts and costs required in configuring facilities employed for the 3D deposition to the substrate side portion 10.

As described above, the substrate side-deposition apparatus 200 according to the disclosure refers to an apparatus for performing the wiring deposition to the lateral side portion 10 of the substrate 30 rather than the top or bottom side of the substrate 30.

Figure 4:
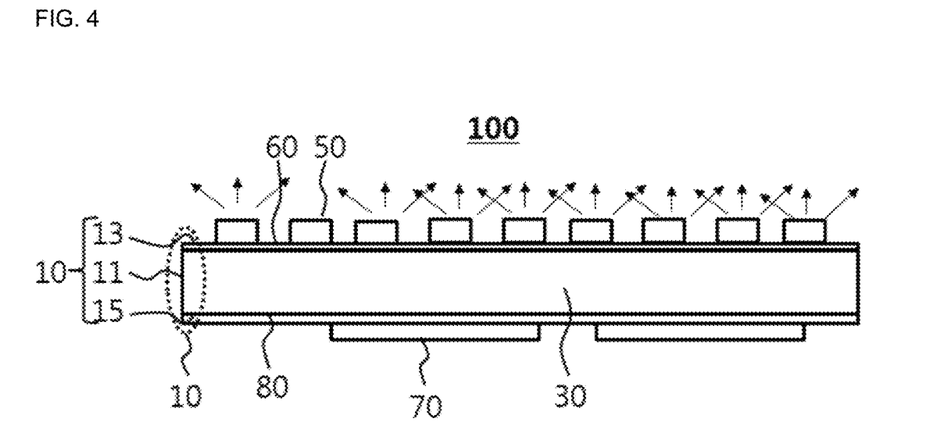
FIG. 4 illustrates a cross-section of an exemplary substrate formed with wiring on a lateral side portion by a substrate side-deposition apparatus according to an embodiment of the disclosure.
Figure 5:
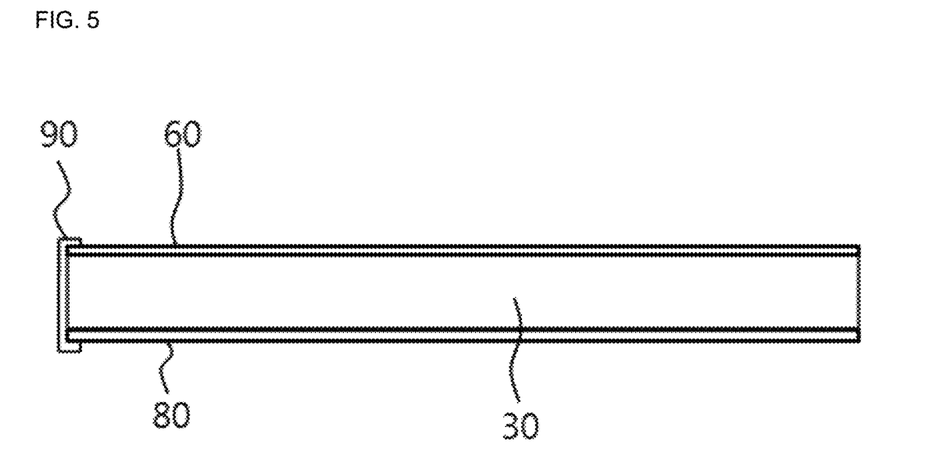
FIG. 5 illustrates a cross-section of a substrate formed with wiring on a substrate side portion by a substrate side-deposition apparatus according to an embodiment of the disclosure.

Specifically, as shown in FIG. 4 and FIG. 5, the substrate side portion 10 according to the disclosure includes the lateral side (see '11' in FIG. 4 and FIG. 5) of the substrate 30, and the top (see '13' in FIG. 4 and FIG. 5) and the bottom (see '15' in FIG. 4 and FIG. 5) of the substrate which are adjacent to the lateral side 11 of the substrate 30, and the wiring on the substrate side portion 10 is formed to electrically connect a top circuit pattern (see '60' in FIG. 4 and FIG. 5) formed on the top of the substrate 30 and a bottom circuit pattern (see '80' in FIG. 4 and FIG. 5) formed on the bottom of the substrate 30.

Below, the technical features of the substrate 30 and the substrate side portion 10 according to the disclosure will be described in detail.

To deposit wiring to the substrate side portion 10 by the substrate side-deposition apparatus 200 according to an embodiment of the disclosure, masking is first applied to the substrate side portion 10 to be formed with the wiring. Specifically, the wiring deposition to the substrate side portion according to the disclosure is based on a sputtering method, and therefore the substrate side portion 10 to be formed with the wiring is subjected to the masking by attaching a deposition mask to the substrate.

The masking of the substrate side portion includes operation of attaching the deposition mask to the substrate so that the wiring can be deposited on the substrate side portion 10 through sputtering. The deposition mask is formed to have a "["-shape, and thus attached to the top and bottom of the substrate as well as the side portion 10 of the substrate 30.

The deposition mask may be formed by a film, metal, and ink printing. In particular, the deposition mask may be given in the form of a polyimide (PI) film. When the PI film is used as the deposition mask, the deposition mask is closely attached to the substrate 30 including the substrate side portion 10 with various kinds of adhesive in between.

With adhesive interposed in between the PI film mask and the substrate 30, the PI film mask is first subjected to a provisional bonding process so as to be temporarily attached to the substrate 30 under a predetermined processing condition, and then subjected to a definite bonding process so as to be bonded to the substrate 30 under a predetermined processing condition.

When the masking of attaching the deposition mask to the substrate 30 including the substrate side portion 10, on which the wiring will be formed, is completed, sputtering operation is performed with regard to the masked substrate 30. That is, the masked substrate 30 is introduced into the vacuum chamber 110 and mounted to the substrate mounting drum 170 while exposing only the substrate side portion 10. Then, the wiring is deposited on the substrate side portion 10 by sputtering in the state that the masked substrate 30 is mounted to the substrate mounting drum 170.

According to the disclosure, the wiring on the substrate side portion 10 is deposited by sputtering inside a vacuum chamber 110. Therefore, when the deposition mask having the "["-shape is attached to a portion of the substrate 30 including the substrate side portion 10 on which the wiring will be formed, the substrate 30 is transferred into the chamber 110 and undergoes a sputtering process in the state that is mounted to the substrate mounting drum 170.

The sputtering process is carried out so that the deposition can be focused upon the substrate side portion 10 on which the wiring will be formed. That is, the sputtering according to the disclosure is performed with regard to not the entire substrate 30 but the substrate side portion 10.

The apparatus of forming the wiring on the substrate side portion 10 through the sputtering according to the disclosure refers to a apparatus of using the sputtering to form the wiring on the side portion of the substrate 300, in which the substrate 30 may include any substrate as long as it is required to form a circuit pattern and connect the circuit pattern via the side portion. In other words, the substrate 30 according to the disclosure includes all sorts of substrates such as glass, plastic, film, etc. on which a circuit pattern is formed and of which a side portion may have wiring for electric connection with the circuit pattern.

Particularly, the substrate 30 according to the disclosure may include a substrate, a top and bottom of which are mounted with various elements and respectively formed with circuit patterns. Further, as shown in FIG. 4, the substrate side portion 10, on which the wiring will be formed, includes a lateral side 11 corresponding to an edge portion of the substrate; a side-adjacent top 13, i.e. a top of the substrate 30 adjacent to the lateral side 11; and a side-adjacent bottom 15, i.e. a bottom of the substrate 30 adjacent to the lateral side 11.

Specifically, as shown in FIG. 4, the substrate side portion 10 according to the disclosure includes the lateral side 11 of the substrate 30, and the top (i.e. the side-adjacent top 13) and the bottom (i.e. the side-adjacent bottom 15) of the substrate which are adjacent to the lateral side 11 of the substrate 30, and the wiring on the substrate side portion 10, i.e. side portion wiring (see '90' in FIG. 5) is formed to electrically connect a top circuit pattern 60 formed on the top of the substrate 30 and a bottom circuit pattern 80 formed on the bottom of the substrate 30.

In more detail, the substrate 30 according to the disclosure may include a substrate used for various elements, devices and apparatuses. For example, the substrate 30 according to the disclosure may be used for a display apparatus 100 as shown in FIG. 2. In this case, display elements 50 such as liquid crystal display (LCD) elements, organic light emitting diodes (OLED), or micro light emitting diodes (LED) may be arrayed to form a display element matrix on the top of the substrate 30. Further, controller elements 70 for controlling the display elements 50 and transceiving an electric signal and various related elements may be formed on the bottom of the substrate 30.

The wiring for the display elements 50, i.e. the top circuit pattern 60 is formed on the top of the substrate 30, and the wiring for the controller elements 70 or the like, i.e. the bottom circuit pattern 80 is formed on the bottom of the substrate 30. Therefore, the side portion wiring 90 for electric connection between the top circuit pattern 60 and the bottom circuit pattern 80 has to be formed on the substrate side portion 10 as shown in FIG. 5.

The side portion wiring 90 formed on the substrate side portion 10 has a cross-section of "⊏" as shown in FIG. 5 so as to electrically connect the top circuit pattern 60 and the bottom circuit pattern 80. Because the side portion wiring 90 has the "⊏"-shape for the electric connection between the top circuit pattern 60 and the bottom circuit pattern 80, the substrate side portion 10 formed with the side portion wiring 90 corresponds to a portion that includes not only the lateral side 11 of the substrate 30 but also the side-adjacent top 13 and the side-adjacent bottom 15 as shown in FIG. 4.

As described above, the masked substrate 30 is introduced into the vacuum chamber 110 as shown in FIG. 1 and subjected to the sputtering. Here, the sputtering in the vacuum chamber 110 is a process for forming the side portion wiring 90 on the substrate side portion 10. Therefore, the sputtering in the vacuum chamber 110 is performed to focus the deposition on the substrate side portion 10.

To this end, the wiring formed on the substrate side portion (i.e. a side-portion wiring 90) according to the disclosure is deposited by sputtering based on the source target 130 while the substrate mounting drum 170 is rotating within the chamber 110. In other words, only the lateral side portion 10 of the substrate 30 is exposed toward the source target 130 and the substrate mounting drum 170 mounted with the substrate 30 rotates while the source target 130 performs the sputtering, and it is therefore possible to perform the 3D deposition to the substrate side portion 10, thereby forming the 3D-deposition wiring on the substrate side portion 10, i.e. a lateral side 11, a side-adjacent top 13 and a side-adjacent bottom 15 of the substrate 30.

In the foregoing substrate side-deposition apparatus 200 according to the disclosure, at least one substrate 30 is mounted to the substrate mounting drum 170 with the substrate side portion 10 facing toward the source target 130, and the substrate mounting drum 170 is rotatable, so that the 3D deposition to the substrate side portion 10 can be uniform and improved in quality.

Below, more-detailed technical features and appended technical features of the substrate side-deposition apparatus 200 according to the disclosure will be described.

As shown in FIGS. 1 and 2, at least one substrate 30 according to the disclosure is radially inserted in and mounted to the substrate mounting drum 170 in the state that the lateral side portion 10 is exposed protruding from the circumferential surface 171 of the substrate mounting drum 170.

To directly mount the substrate 30 to the substrate mounting drum 170, the substrate mounting drum 170 needs to structurally secure and configure a space for stably accommodating the substrate 30. However, it disadvantageous to make the substrate mounting drum 170 have such a structure for directly inserting and accommodating the substrate 30 therein because time, efforts and costs are required more than needs.

Further, when the substrate mounting drum 170 has a structure for directly inserting and accommodating the substrate 30 therein, the structure is disadvantageous to mount the substrates 30 of various sizes. That is, to make the substrate side-deposition apparatus adapted to the substrates 30 of various sizes, substrate mounting drums are individually needed corresponding to the substrates of various sizes, thereby wastefully requiring time, efforts and costs.

Therefore, the substrate 30 according to the disclosure is, as shown in FIGS. 1 and 2, inserted in and mounted to a substrate mounting slot 150 radially mounted to the substrate mounting drum 170.

Specifically, the substrate side-deposition apparatus 200 according to an embodiment of the disclosure includes the substrate mounting slot 150 mounted to the substrate mounting drum 170. The substrate mounting slot 150 is detachably mounted to the substrate mounting drum 170. Thus, the substrate mounting slot 150, the size of which corresponds to the size of the substrate 30 to be subjected to the deposition, is mounted to the substrate mounting drum 170.

For example, in a case where a substrate having a certain size is subjected to the deposition and then another substrate having a different size is subjected to the deposition, a certain substrate mounting slot 150 that has been mounted to the substrate mounting drum 170 for the deposition to the substrate having the certain size is separated and then another substrate mounting slot 150 for inserting and mounting the substrate having the different size is newly mounted to the substrate mounting drum 170. Consequently, the substrate side-deposition apparatus 200 according to an embodiment of the disclosure can perform the wiring deposition with regard to the substrates having various sizes without changing the substrate mounting drum 170.

In this regard, a plurality of substrate mounting slots 150 are radially mounted to the substrate mounting drum 170. That is, the plurality of substrate mounting slots 150 are mounted as oriented from the circumferential surface toward the center of the substrate mounting drum 170. The substrate mounting slots 150 may be mounted to the substrate mounting drum 170 by a bolt fastening method or the like, and have not only a structure for inserting and accommodating the substrate 30 but also a structure for keeping the inserted substrate stable without a large gap.

Further, the substrate mounting slot 150 may have a closed structure except an opened part via which the substrate is inserted (i.e. an exposure part on the circumferential surface 171 of the substrate mounting drum 170), or a frame structure for accommodating and supporting the substrate 30.

The substrate 30 is inserted in and mounted to the substrate mounting slot 150 mounted to the substrate mounting drum 170. That is, the substrate 30 is inserted in and mounted to the substrate mounting slot 150 mounted to the substrate mounting drum 170. The substrate mounting slot 150 may have various structures or various media to hold the substrate 30 inserted therein so that the substrate 30 cannot be separated from the substrate mounting slot 150. For example, the substrate mounting slot 150 may employ a high-temperature adhesive tape, a separate clamp or the like, or one of various structures and methods to hold the substrate 30 inserted therein.

In the state that the plurality of substrates 30 are inserted one by one in the plurality of substrate mounting slots 150 mounted to the substrate mounting drum 170, the lateral side portions 10 of the substrates 30 are subjected to the wiring deposition based on the sputtering. In such a process, heat is generated from the substrate 30 itself, the substrate mounting drum 170, and surroundings, and this heat may be transferred to the substrate 30 and exert a bad influence upon the substrate 30. Further, when the heat effectively radiates from the substrate 30, a sputtering efficiency to the substrate 30 is improved.

Like this, heat radiation is needed for the substrate 30. To efficiently radiate the heat from the substrate 30, a cooling path (not shown) may be formed in the substrate mounting drum 170. Specifically, the cooling path is inserted via the rotary rod 175 and then comes out of the rotary rod 175 after passing by the plurality of substrates 30 mounted to the substrate mounting drum 170.

Meanwhile, the substrate side-deposition apparatus 200 according to an embodiment of the disclosure may include a plurality of source targets 130 as shown in FIG. 1. A single source target 130 may be provided to perform the 3D wiring deposition to the lateral side portions 10 of the plurality of substrates 30 rotating within the vacuum chamber 110. The plurality of source targets 131, 133, 135 may be provided to perform the 3D wiring deposition to the lateral side portions 10 of the plurality of rotating substrates 30. FIG. 1 illustrates that the source target 130 includes three source targets, i.e. a first source target 131, a second source target 133, and a third source target 135.

When the plurality of source targets 130 are used as described above, the plurality of source targets (for example, the first source target 131, the second source target 133, and the third source target 135 as shown in FIG. 1) may include cathode targets of the same metal, i.e. the same metal targets, or may include cathode targets of different metals, i.e. different metal targets as necessary.

Like this, the source target 130 of the disclosure includes the plurality of source targets 131, 133 and 135, and the plurality of source targets (for example, the first source target 131, the second source target 133 and the third source target 135 of FIG. 1) may be provided as the same metal targets or the different metal targets.

The former case (where there are a plurality of source targets and the plurality of source targets are provided as the same metal targets) is applied to form the wiring of only a single metal layer on the substrate side portion 10. In other words, the plurality of source targets include the same metal targets of the same metal.

When the plurality of source targets 130 including the same metal targets is employed, the plurality of substrates 30 is continuously subjected to the sputtering and the wiring is deposited while the substrate mounting drum 170 rotates. In result, the wiring deposition is more quickly performed with regard to the lateral side portions of the plurality of substrates 30, and thus a production efficiency and a deposition efficiency are improved.

When there are a plurality of source targets 130 and the plurality of source targets 130 are provided as the same metal targets as described above, a plurality of substrates 30 may be mounted at regular intervals (i.e. leaving the same included angles between adjacent substrates), and the plurality of source targets 130 may also be arranged at regular intervals leaving the same distances as the distances between the lateral side portions 10 of the adjacent substrates.

Thus, when the plurality of substrates 30 are mounted at the same included angle there between and the plurality of source targets 130 are also arranged as spaced apart at the same distance as the distance between the lateral side portions 10 of the adjacent substrates 30, the deposition may be equally and uniformly performed to the lateral side portions 10 of the substrates 30 while the substrate mounting drum 170 rotates, and the wiring deposited on each substrate side portion 10 may also be improved in uniformity.

On the other hand, the latter case (where there are a plurality of source targets and the plurality of source targets are provided as the different metal targets) is applied to form the wiring of a plurality of metal layers on the substrate side portion 10. In other words, the plurality of source targets include the different metal targets of the different metals.

For example, as shown in FIG. 1, when the source target 130 includes three source targets, i.e. the first source target 131, the second source target 133, and the third source target 135, different metal targets are provided as the first source target 131, the second source target 133 and the third source target 135. In this case, the first source target 131 may be used to deposit a first metal layer on the substrate side portion 10, the second source target 133 may be used to deposit a second metal layer on the first metal layer, and the third source target 135 may be used to deposit a third metal layer on the second metal layer. In this case, the wiring deposited on the substrate side portion 10 is formed as the first metal layer, the second metal layer and the third metal layer are deposited in sequence.

When there are a plurality of source targets 130 and the plurality of source target 130 are provided as different metal targets, only a certain source target 130 operates to perform the sputtering and the other source targets do not perform the sputtering. That is, only one source target is controlled to operate, but the other source targets are controlled not to operate.

When only one source target operates to perform the sputtering, the 3D deposition is performed with regard to the plurality of substrates mounted to the substrate mounting drum 170, in particular, to the substrate side portion 10 as the substrate mounting drum 170 rotates. In other words, first metal of the source target for performing the sputtering is deposited to the plurality of substrate side portions of the substrates mounted to the substrate mounting drum 170, thereby forming the first metal layer. For example, when only the first source target 131 of FIG. 1 operates to perform the sputtering but the second source target 133 and the third source target 135 do not operate, the first metal of the first source target 131 is sputtered to the plurality of substrate side portions 10 and thus the first metal layer is deposited.

When the first metal layer is completely deposited, only another source target (e.g. the second source target 133) adjacent to the source target (e.g. the first source target 131) used for sputtering the first metal layer operates to perform the sputtering and the other source targets (e.g. the first source target 131 and the third source target 135) do not operate. In result, second metal of the second source target 133 is sputtered to the plurality of substrate side portions 10, and thus the second metal layer is deposited on the first metal layer.

When the second metal layer is completely deposited, only another source target (e.g. the third source target 135) adjacent to the source target (e.g. the second source target 133) used for sputtering the second metal layer operates to perform the sputtering and the other source targets (e.g. the first source target 131 and the second source target 133) do not operate. In result, third metal of the third source target 135 is sputtered to the plurality of substrate side portions 10, and thus the third metal layer is deposited on the second metal layer.

Like this, the plurality of source targets 130 sequentially operate to perform sputtering and deposit the corresponding metal layers to the substrate side portion 10 in sequence, thereby finally forming the wiring as a plurality of metal layers on the substrate side portion 10.

When there are a plurality of source targets 130 and the plurality of source targets 130 are provided as the different metal targets as described above, only one source target of a specific metal target among the plurality of source targets is controlled to operate and perform sputtering of metal corresponding to the specific metal target to the substrate side portion.

During such a process, another source target (e.g. the second source target 133) adjacent to a certain source target (e.g. the first source target 131) should not be contaminated with the sputtering from the metal target of the certain source target. That is, there is a need of preventing metal of a certain metal target for a certain source target from being deposited on a different metal target for another adjacent source target.

Figure 3:
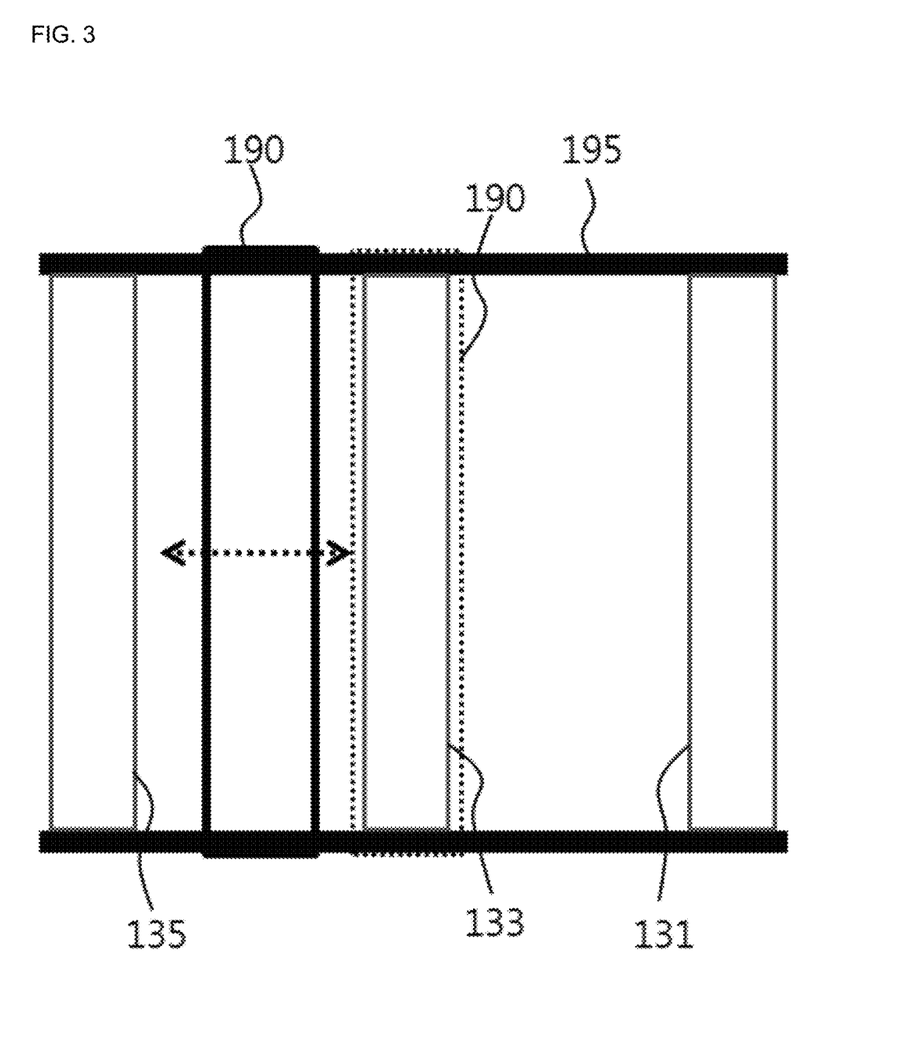
FIG. 3 is a schematic plan view showing a layout relationship among a source target, a target shutter and a movement rail in a substrate side-deposition apparatus according to an embodiment of the disclosure.

To this end, as shown in FIGS. 1 and 3, the substrate side-deposition apparatus 200 according to the disclosure may further include the target shutter 190 to cover the surfaces of the adjacent different source targets in order to prevent the metal of the source target performing the sputtering from being deposited on the adjacent different source target. That is, when the plurality of source targets 130 are provided as different metal targets according to the disclosure, the target shutter 190 is further provided to cover the surface of the different source target 130 adjacent to the source target 130 performing the sputtering.

As shown in FIGS. 1 and 3, the target shutter 190 may be movable along a movement rail 195. The movement rail 195 forms a pair along both sides of each target source so as to prevent the sputtering of the plurality of target sources 131, 133 and 135 from interfering with each other. Further, the target shutter 190 includes opposite ends to be engaged with and put on the pair of movement rails 195 arranged along both sides of each target source.

Therefore, the target shutter 190 is movable along the pair of rails 195, and the target shutter 190 is controlled to move and cover the surfaces of the different source targets adjacent to a certain source target performing the sputtering. In result, while a certain source target performs the sputtering, other adjacent source targets are prevented from being contaminated by metal deposition from the metal target of the certain source target.

Although FIG. 3 illustrates that the single target shutter 190 is movably provided on one pair of rails 195, two target shutters 190 may be movably provided on one pair of rails 195 as necessary. In this case, as shown in FIG. 3, when the middle source target 133 among the three source targets 131, 133 and 135 is controlled to perform the sputtering, the two target shutters 190 are controlled to respectively move to the other two adjacent source targets 131 and 135 and cover the surfaces of their source targets.

In a substrate side-deposition apparatus according to the disclosure, at least one substrate is mounted to a substrate mounting drum with a substrate side portion facing toward a source target, and the substrate mounting drum is rotatable, so that 3D deposition to the substrate side portion can be uniform and improved in quality.

Although a few exemplary embodiments of the disclosure have been shown and described, it will be appreciated by those skilled in the art that changes may be made in these embodiments without departing from the principles and spirit of the invention, the scope of which is defined in the appended claims and their equivalents.

What is claimed is:
1. A wiring deposition apparatus for a lateral side substrate, comprising:
a substrate mounting drum rotatable within a chamber and allowing at least one substrate to be inserted and mounted in a direction from a circumferential surface toward a center;
a substrate mounting slot detachably and radially mounted to the substrate mounting drum; and at least one source target configured to deposit wiring based on sputtering to the lateral side substrate exposed protruding from the circumferential surface of the substrate mounting drum, wherein:

the lateral side substrate includes a lateral side of the substrate, and top and bottom sides of the substrate adjacent to the lateral side, the wiring on the lateral side substrate is formed to electrically connect a top circuit pattern formed on the top side of the substrate and a bottom circuit pattern formed on the bottom side of the substrate, the substrate is inserted in and mounted to the substrate mounting slot, and the source target includes a plurality of source targets, and the plurality of source targets includes same metal targets or different metal targets.

2. The wiring deposition apparatus for a lateral side substrate according to claim 1, further including a target shutter configured to cover the surfaces of other source targets adjacent to a source target performing the sputtering when the plurality of source targets includes the different metal targets.

\* \* \* \* \*